United States Patent [19]

Takahashi et al.

[11] 4,403,187
[45] Sep. 6, 1983

[54] MAGNETIC HEAD FOR SENSING THE POSITION OF A MOVING MEMBER

[75] Inventors: Tadashi Takahashi, Hitachi; Hiroshi Hayashida, Mito; Kunio Miyashita, Hitachi, all of Japan

[73] Assignee: Hitachi, Ltd., Tokyo, Japan

[21] Appl. No.: 215,330

[22] Filed: Dec. 11, 1980

[30] Foreign Application Priority Data

Dec. 19, 1979 [JP] Japan .................................. 54-164116

[51] Int. Cl.³ ........................ G01B 7/14; G01R 33/06
[52] U.S. Cl. ................................... 324/208; 324/252; 338/32 R; 340/347 P
[58] Field of Search ............... 324/208, 252, 173, 174, 324/207; 360/113; 338/32 R; 340/347 P; 382/64

[56] References Cited

U.S. PATENT DOCUMENTS

| | | | |
|---|---|---|---|
| 3,993,946 | 11/1976 | Makino | 324/208 |
| 4,039,936 | 8/1977 | Jones et al. | 324/208 |
| 4,119,911 | 10/1978 | Johnson | 324/208 |
| 4,255,708 | 3/1981 | Wilson | 324/208 |
| 4,274,053 | 6/1981 | Ito et al. | 324/208 X |

*Primary Examiner*—Gerard R. Strecker
*Attorney, Agent, or Firm*—Antonelli, Terry & Wands

[57] ABSTRACT

Disclosed is a magnetic head for use to constitute a position encoder which comprises a magnetic recording medium carrying records provided by a plurality of unit magnets arrayed with a constant pitch $\lambda$ on the surface of a moving member. The magnetic head is fixedly disposed opposite to the magnetic recording medium to constitute the position encoder. The magnetic head comprises a bridge circuit of four U-shaped arms each of which is formed by a pair of magnetoresistive elements spaced apart by an interval of $(\lambda/2)(1+n)$, where n is zero or a positive integer.

6 Claims, 3 Drawing Figures

4,403,187

MAGNETIC HEAD FOR SENSING THE POSITION OF A MOVING MEMBER

BACKGROUND OF THE INVENTION

1. Field of the Invention

This invention relates to a position encoder for encoding the position of a moving member, and more particularly to a magnetic head of such a position encoder employing a magnetoresistive element.

2. Description of the Prior Art

It is known that, when a magnetoresistive element of material such as permalloy is placed in a magnetic field and a current is supplied thereto, the resistance value of the magnetoresistive element changes in accordance with the strength of the magnetic field. A transducer apparatus comprising a magnetic head formed by such magnetoresistive elements for detecting relative displacement of a magnetic information carrying medium is also commonly known from, for example, U.S. Pat. No. 4,039,936 entitled "INTERLEAVED MAGNETORESISTIVE DISPLACEMENT TRANSDUCERS" and patented to A. L. Jones et al on Aug. 2, 1977. This U.S. Pat. No. 4,039,936 discloses a magnetoresistive displacement transducer arrangement for toothed magnetic members in which each transducer is formed by a pair of interconnected sections spaced from each other by the width of a tooth to provide greater change and improved symmetry in the output signal at the tooth edges. Further, this U.S. Pat. No. 4,039,936 shows in FIG. 4 a bridge circuit arrangement suitable for producing a variable voltage output in accordance with rack tooth detection. In this bridge circuit, one input terminal is connected at the junction between two series-connected equal resistors and the other input terminal is connected at a center tap between two magnetoresistive sections. Suppose that transducers such as those disclosed in this U.S. Pat. No. 4,039,936 are used to form a magnetic rotation encoder in which the two magnetoresistive sections have the same resistance value R. When a voltage V is applied across the input terminals of this magnetic rotation encoder, the variation in the output voltage due to a variation $\Delta R$ in the resistance value R of the magnetoresistive sections owing to a variation in the magnetic flux density is approximately given by $(\Delta R/2R)V$, as described in further detail later. Thus, the output variation is only $\frac{1}{2}$ of the output variation in each magnetoresistive section due to the resistance variation rate of $\Delta R/R$, and this means that the detection sensitivity of the magnetic rotation encoder is only as high as $\frac{1}{2}$ at the most. Further, the magnetic rotation encoder is only capable of generating an output signal having the same frequency as that of the magnetic information or teeth and is not capable of generating an output signal having a higher frequency.

SUMMARY OF THE INVENTION

It is a primary object of the present invention to provide an arrangement of a magnetic head of a position encoder which can operate with an improved detection sensitivity and which can generate an output signal having a frequency two times as high as that of magnetic information.

In accordance with one aspect of the present invention, there is provided a position encoder comprising a magnetic recording medium carrying records provided by a plurality of unit magnets circumferentially arranged on the surface of a moving member with a predetermined constant pitch $\lambda$ and a magnetic head disposed opposite to the magnetic recording medium. The magnetic head comprises a bridge circuit including four arms. Each of the four arms includes one pair of magnetoresistive elements fixedly supported opposite to and extending across a portion of the magnetic recording medium and electrically connected to each other at one end thereof to form a U-like configuration, the longitudinal axes of the magnetoresistive elements in each pair being spaced apart by an interval of $(\lambda/2)(1+n)$ in the circumferential direction of the magnetic recording medium, where n is zero or any suitable positive integer.

If the interval between any two magnetoresistive elements each of which belongs to one of two arms among the four arms is defined as the interval between the two arms when the interval between the two magnetoresistive elements is a minimum, the interval between the two arms adjoining each other on opposite sides of each of the junctions in each of the two pairs of the opposite junctions in the bridge circuit including the four arms is preferably selected to be $(\lambda/4)(1+2n)$, and the interval between the two arms in each of the two pairs of the opposite arms is preferably selected to be $(\lambda/2)(1+n)$, where n is zero or any suitable positive integer.

DESCRIPTION OF THE PREFERRED EMBODIMENT

Figure 1:
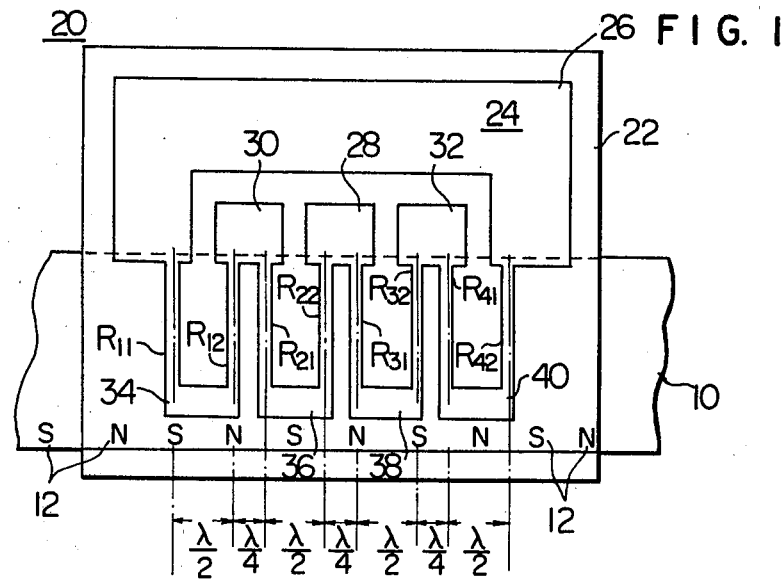
FIG. 1 is a schematic view showing the structure of a preferred embodiment of the position encoder comprising the magnetic head according to the present invention.

Referring to FIG. 1, a magnetic recording medium 10 is partly shown in an enlarged fashion. This magnetic recording medium 10 can be provided to extend in the circumferential direction on the circular surface of a rotary member, for example, a rotary disc or a rotary cylinder whose rotation is to be detected or encoded, and a plurality of unit magnets or N-S pole pairs 12 are recorded at intervals of a predetermined constant distance or pitch $\lambda$ as shown. Of course, as is apparent from FIG. 1, the magnetic recording medium can also be provided on a linearly moving member. A magnetic head 20 is fixedly supported opposite to the magnetic recording medium 10 and includes a magnetoresistive pattern 24 formed on a single chip of a substrate 22 of nonmagnetic material by customary means such as evaporation or etching. The magnetoresistive pattern 24 includes eight magnetoresistive elements $R_{11}$, $R_{12}$, $R_{21}$, $R_{22}$, $R_{31}$, $R_{32}$, $R_{41}$ and $R_{42}$ arrayed in a relation substantially longitudinally parallel with each other, and all of these magnetoresistive elements $R_{11}$ to $R_{42}$ are connected in series to form what is sometimes referred to as a diamond type bridge circuit such as shown in FIG. 2.

Figure 2:
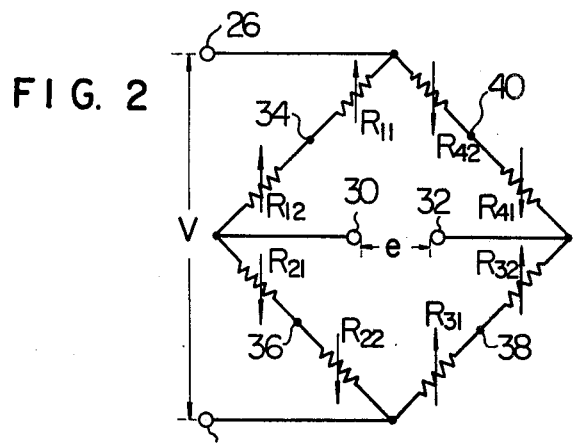
FIG. 2 is an electrical circuit diagram of the magnetic head shown in FIG. 1.

Referring to FIG. 2, the series-connected magnetoresistive elements $R_{11}$ and $R_{12}$, $R_{21}$ and $R_{22}$, $R_{31}$ and $R_{32}$, and $R_{41}$ and $R_{42}$ constitute a first arm, a second arm, a third arm and a fourth arm respectively of the bridge circuit. One pair of external power supply connection terminals 26 and 28 are formed at one pair of opposite junctions, for example, the junction between the first and fourth arms and the junction between the second and third arms respectively, and one pair of output terminals 30 and 32 are similarly formed at the other pair of opposite junctions, for example, the junction between the first and second arms and the junction between the third and fourth arms respectively.

The arrangement of the magnetic head 20 will be described in further detail with reference to FIG. 1. The first arm has a U-like configuration formed by the pair of the magnetoresistive elements $R_{11}$ and $R_{12}$ extending across the associated portion of the magnetic recording medium 10 and electrically connected to each other at one end thereof by a connecting portion or strip 34. The material of this electrical connecting strip 34 may be the same as that of the magnetoresistive elements $R_{11}$ and $R_{12}$ or may be a usual electrical conductor such as silver, copper or the like. Employment of silver, copper or like electrical conductor improves naturally the output sensitivity, but the process becomes considerably troublesome and time-consuming. Like the first arm of U-like configuration, the second arm, third arm and fourth arm of U-like configuration are also formed by the magnetoresistive elements $R_{21}$, $R_{22}$ and an electrical connecting portion or strip 36, the magnetoresistive elements $R_{31}$, $R_{32}$ and an electrical connecting portion or strip 38, and the magnetoresistive elements $R_{41}$, $R_{42}$ and an electrical connecting portion or strip 40, respectively. One of the pair of the magnetoresistive elements providing the first arm, that is, the element $R_{11}$ and one of the pair of the magnetoresistive elements providing the fourth arm, that is, the element $R_{42}$ are electrically connected to each other at the other end thereof by an electrical connecting portion or strip which provides one of the pair of the input terminals, that is, the terminal 26. One of the pair of the magnetoresistive elements providing the second arm, that is, the element $R_{22}$ and one of the pair of the magnetoresistive elements providing the third arm, that is, the element $R_{31}$ are electrically connected to each other at the other end thereof by an electrical connecting portion or strip which provides the other input terminal 28. Similarly, the other magnetoresistive element $R_{12}$ in the first arm and the other magnetoresistive element $R_{21}$ in the second arm are electrically connected to each other at the other end thereof by an electrical connecting portion or strip which provides one of the output terminals or the terminal 30. The other magnetoresistive element $R_{32}$ in the third arm and the other magnetoresistive element $R_{41}$ in the fourth arm are electrically connected to each other at the other end thereof by an electrical connecting portion or strip which provides the other output terminal 32. The material of these connecting strips or terminals 26, 28, 30 and 32 may be the same as that of the magnetoresistive elements $R_{11}$ to $R_{42}$ like that of the connecting strips 34, 36, 38 and 40 or may be a good electrical conductor such as silver, copper or the like. The merit and demerit of employment of silver, copper or like electrical conductor are as described hereinbefore.

It will be readily understood that the interval between the adjacent ones among the magnetoresistive elements $R_{11}$ to $R_{42}$ arrayed in such a relation is especially important since the magnetoresistive elements $R_{11}$ to $R_{42}$ constitute the four arms of the bridge circuit. The pair of the magnetoresistive elements $R_{11}$ and $R_{12}$ providing the first arm are disposed to define an interval of $\lambda/2$ therebetween in the circumferential direction of the rotary member, that is, in the arranged direction of the unit magnets 12 representing the magnetic information. In the present invention, the interval referred to above is defined to indicate the distance between the longitudinal central axes of the adjacent magnetoresistive elements. The symbol $\lambda$ designates the pitch of the magnetic information or N-S pole pairs 12. Herein, the pitch $\lambda$ of the magnetic information or N-S pole pairs is defined to indicate the distance between one of the N poles and the next adjacent N pole, hence, between one of the S poles and the next adjacent S pole. It will be understood that, by virtue of such an arrangement of the magnetic head 20, the resistance values of the pair of, for example, the magnetoresistive elements $R_{11}$ and $R_{12}$ constituting the first arm increase or decrease at the same rate in complete synchronism with the displacement of the magnetic recording medium 10 relative to the magnetic head 20. This means also that the interval between the magnetoresistive elements $R_{11}$ and $R_{12}$ may be $\lambda/2 \, (1+n)$, where n may be zero or any suitable positive integer. The same applies also to the interval between the magnetoresistive elements $R_{21}$, $R_{22}$; $R_{31}$, $R_{32}$; and $R_{41}$, $R_{42}$ constituting in pair the second, third and fourth arms respectively.

The interval between two of the individual arms of the bridge circuit will next be discussed. Herein, the interval between one of the pair of the magnetoresistive elements constituting one of the two arms and one of the pair of the magnetoresistive elements constituting the other arm is defined as the interval between these two arms when those two magnetoresistive elements are selected to define a narrowest interval therebetween. In the embodiment shown in FIG. 1, the interval between the first and second arms having the output terminal 30 formed at the junction therebetween, that is, the interval between the magnetoresistive elements $R_{12}$ and $R_{21}$ is selected to be $\lambda/4$. Similarly, the interval between the third and fourth arms having the output terminal 32 formed at the junction therebetween, that is, the interval between the magnetoresistive elements $R_{32}$ and $R_{41}$ is also selected to be $\lambda/4$. This is because, when the resistance change (the absolute value) in one of the two adjacent arms, for example, the first and second arms having the output terminal 30 formed at the junction therebetween attains its maximum, that of the other can be rendered minimum. It will be readily understood from the above that the interval between such two adjacent arms may be $$\frac{\lambda}{4} + n \cdot \frac{\lambda}{2} = \frac{\lambda}{4} (1 + 2n),$$

where n is also zero or any suitable positive integer as described hereinbefore.

In the embodiment shown in FIG. 1, the interval between the second and third arms having the external power supply connection terminal 28 formed at the junction therebetween is also selected to be $\lambda/4$. The reason therefor is the same as that described with regard to the first and second arms and the third and fourth arms. Therefore, this interval may also be $\lambda/4 \, (1+2n)$, where n is zero or any suitable positive integer as described hereinbefore. In the embodiment shown in FIG. 1, the interval between the first and fourth arms having the external power supply connection terminal 26 formed at the junction therebetween is selected to be 7/4 λ. This represents the value obtained when n is selected to be n=3 in the expression (80/4)(1+2n). It will however be readily understood that the individual arms may be disposed so that, for example, the first and fourth arms may adjoin each other in lieu of the arranged order of the arms described with reference to FIG. 1. In such a case, the interval between the first and fourth arms is also λ/4. Thus, the interval between the first and fourth arms may also be λ/4 (1+2n) in this case. The same applies also to the interval between the second and third arms.

The interval between the two arms disposed opposite to each other in the bridge circuit shown in FIG. 2, that is, that between the first and third arms and that between the second and fourth arms will now be discussed. In the embodiment shown in FIG. 1, the interval between the two arms disposed opposite to each other in the bridge circuit shown in FIG. 2, that is, that between the second and fourth arms as well as that between the first and third arms is selected to be equal to λ. This is because the interval between the two arms disposed opposite to each other in the bridge circuit shown in FIG. 2 needs be selected so that the resistance values thereof increase or decrease at the same rate in complete synchronism with the displacement of the magnetic recording medium 10 relative to the magnetic head 20. Therefore, the interval between these two opposite arms is not limited to λ and may be (λ/2)(1+n), where n is zero or any suitable positive integer. The embodiment shown in FIG. 1 illustrates that n=1 in the expression (λ/2)(1+n). It will be therefore readily understood that the arranged order of the arms will remain the same as that shown in FIG. 1 when n>2, while the arranged order should be suitably changed when n=0.

Figure 3:
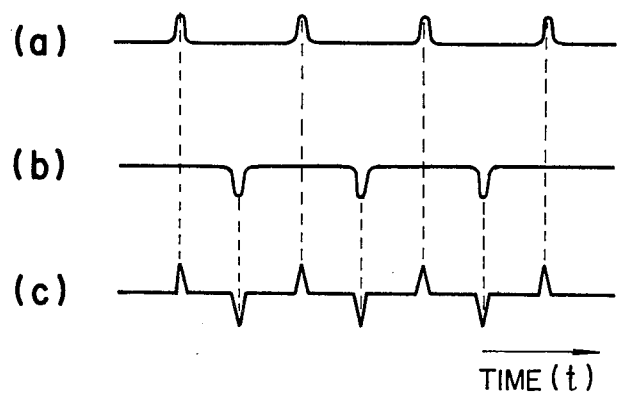
FIG. 3 shows output waveforms generated from the magnet head shown in FIG. 1, hence, those generated from the electrical circuit shown in FIG. 2.

FIG. 3 is a waveform diagram showing variations of an output voltage e relative to time when an input voltage V is applied to the embodiment shown in FIG. 1, hence, across the input terminals 26 and 28 in the bridge circuit shown in FIG. 2. FIG. 3 shows in (a) the waveform of the output voltage induced by the first and third arms, in (b) the waveform of the output voltage induced by the second and fourth arms, and in (c) the composite waveform of those shown in (a) and (b), hence, the waveform of the overall output voltage e generated from the bridge circuit.

Suppose now that the bridge is balanced in the absence of a magnetic field. Then, when the S pole or N pole of the magnetic recording medium 10 approaches each of the magnetoresistive elements $R_{11}$ and $R_{12}$ constituting the first arm and each of the magnetoresistive elements $R_{31}$ and $R_{32}$ constituting the third arm, their resistance values decrease, and a positive voltage peak appears across the output terminals 30 and 32. When the next N pole or S pole approaches each of the magnetoresistive elements $R_{11}$, $R_{12}$ and $R_{31}$, $R_{32}$ with the displacement of the magnetic recording medium 10 relative to the magnetic head 20, the resistance values of these magnetoresistive elements decrease similarly, and a positive voltage peak appears also across the output terminals 30 and 32. The waveform shown in (a) of FIG. 3 represents repeated or periodical appearance of such a positive voltage peak. The frequency of periodical appearance of the positive peaks is equal to the frequency of repeated or successive passage of the N poles and S poles in front of one of the magnetoresistive elements, and, therefore, the former frequency is two times as high as the frequency f of successive passage of the unit magnets or N-S pole pairs 12 in front of one of the magnetoresistive elements. The same applies also to the magnetoresistive elements $R_{21}$, $R_{22}$ and $R_{41}$, $R_{42}$ constituting the second and fourth arms respectively. In this latter case, however, a negative voltage peak appears across the output terminals 30 and 32 as seen in (b) of FIG. 3. It will be apparent from FIG. 1 that the second and fourth arms are spaced apart by an interval of λ/4 (1+2n) from the first and third arms respectively. Therefore, when each of the first and third arms is opposed by the N pole or S pole, each of the second and fourth arms is located intermediate between the N pole and the S pole without affecting the output, while when each of the first and third arms is located intermediate between the N pole and the S pole, each of the second and fourth arms is opposed by the N pole or S pole to generate the negative voltage peak appearing across the output terminals 30 and 32. It will therefore be readily understood that the output voltage generated from the second and fourth arms has a waveform as shown in (b) of FIG. 3, and the negative voltage peak appears between the positive voltage peaks shown in (a) of FIG. 3. Consequently, a composite output waveform as shown in (c), which is the combination of the waveforms shown in (a) and (b) of FIG. 3, appears across the output terminals 30 and 32 of the bridge circuit in which the magnetoresistive arms are arranged in a relation as shown in the embodiment of FIG. 1. It will be seen from the output voltage waveform shown in (c) of FIG. 3 that the period of the peaks in the output voltage waveform generated from the bridge circuit, that is, the period of time between, for example, one of the positive peaks and the next is ½ of the period of successive passage of the N-S pole pairs in front of one of the magnetoresistive elements, that is, the period of time elapsed until, after the passage of, for example, one of the N poles in front of the magnetoresistive element, the next N pole passes in front of the magnetoresistive element. It will be understood that, in other words, the frequency of the output voltage signal generated from the bridge circuit is two times as high as the passing frequency of the magnetic information or N-S pole pairs.

The level of the output voltage will now be discussed. At first, a bridge circuit construction will be considered in which, for example, the first and second arms in the bridge circuit shown in FIG. 2 of the present application are provided by magnetoresistive elements and the third and fourth arms are provided by fixed resistors as illustrated in the afore-mentioned U.S. Pat. No. 4,039,936. Suppose that the resistance value of the first arm changes from R to R+ΔR and that of the second arm changes from R to R−ΔR in such a bridge circuit. Then, the variation ΔV of the output voltage e is given by $$\Delta V = \left( \frac{R}{R + (R + \Delta R)} - \frac{R - \Delta R}{R + (R - \Delta R)} \right) V$$

$$= \left( \frac{R}{2R + \Delta R} - \frac{R - \Delta R}{2R - \Delta R} \right) V$$

Since there is the relation 2R >> ΔR in the above equation, ΔV is now expressed as $$\Delta V \approx \left( \frac{R}{2R} - \frac{R - \Delta R}{2R} \right) V = \frac{\Delta R}{2R} V$$

as described already with reference to U.S. Pat. No. 4,039,936.

In contrast, according to the present invention, the opposite arms of the bridge circuit, that is, the first and third arms and the second and fourth arms undergo the same synchronous changes in their resistance values respectively. Thus, when, for example, the resistance value of each of the first and third arms changes from R to $R+\Delta R$ and that of each of the second and fourth arms changes from R to $R-\Delta R$, it will be readily understood that the variation $\Delta V$ of the output voltage e is two times as large as that in U.S. Pat. No. 4,039,936, that is, $\Delta V$ is given by $$\Delta V = \frac{\Delta R}{R} V$$

in the present invention.

According to the embodiment of the present invention, therefore, a single magnetic head can detect the frequency two times as high as that in the prior art, and, at the same time, the output sensitivity can also be improved to the level which is two times as high as that in the prior art.

The embodiment of the present invention provides such meritorious effects that the magnetic head can be manufactured simply and yet with high accuracy by customary means such as evaporation or etching and that the magnetic head is not so expensive.

According to the embodiment of the present invention, all of the input terminals 26, 28 and the output terminals 30, 32 to be connected to input and output leads can be formed on the same side of the substrate. This is advantageous in that the leads can be easily led out to the external circuits, and the leads can be connected to the input and output terminals in such a manner as to sufficiently reduce the gap between the magnetic head and the magnetic recording medium.

We claim:

1. In a position encoder comprising a magnetic recording medium carrying records provided by a plurality of unit magnets arrayed on the surface of a moving member with a predetermined constant pitch λ, which unit magnets move along with the moving member in the direction of movement and retain said predetermined constant pitch λ during said movement, and a magnetic head disposed adjacently opposite to said magnetic recording medium, an arrangement of the magnetic head comprising:

(a) a bridge circuit including four arms;
   (b) one pair of external power supply connection terminals formed on one of the two pairs of the opposite junctions in said bridge circuit respectively;
   (c) one pair of output terminals formed on the other of the two pairs of the opposite junctions in said bridge circuit respectively; and
   (d) each of said four arms including one pair of magnetoresistive elements fixedly supported opposite to and extending across a portion of said magnetic recording medium and electrically connected to each other at one end thereof to form a U-like configuration, the longitudinal axes of said magnetoresistive elements in each pair being spaced apart from each other by an interval of $(\lambda/2)(1+n)$ in the moving direction of said magnetic recording medium, where n is zero or any suitable positive integer.

2. An arrangement of a magnetic head as claimed in claim 1, wherein, under the definition that the interval between any two arms among said four arms is represented by a minimum interval among the intervals between any legs which individually belong to the respective two arms one by one, the interval between two of said four arms adjacently by arranged in said bridge circuit through each of the junctions in each of said two pairs of opposite junctions in said bridge circuit is selected to be $(\lambda/4)(1+2n)$, and the interval between the two arms in each of the two pairs of the opposite arms in said bridge circuit is selected to be $(\lambda/2)(1+n)$, where n is zero or any suitable positive integer.

3. An arrangement of the magnetic head as claimed in claim 1 or 2, wherein all of said external power supply connection terminal pair and said output terminal pair are formed on the same side with respect to the array of said magnetoresistive elements.

4. In a position encoder comprising a magnetic recording medium carrying records provided by a plurality of unit magnets arrayed on the surface of a moving member with a predetermined constant pitch λ, which unit magnets move along with the moving member in the direction of movement and retain said predetermined constant pitch λ during said movement, and a magnetic head disposed adjacently opposite to said magnetic recording medium, an arrangement of the magnetic head comprising:

(a) a bridge circuit including four arms;
   (b) one pair of external power supply connection terminals formed on one of the two pairs of the opposite junctions in said bridge circuit respectively;
   (c) one pair of output terminals formed on the other of the two pairs of the opposite junctions in said bridge circuit respectively; and
   (d) each of said four arms including one pair of magnetoresistive elements fixedly supported opposite to and extending across a portion of said magnetic recording medium and electrically connected to each other at one end thereof to form a U-like configuration, the longitudinal axis of said magnetoresistive elements in each pair being spaced apart from each other in the moving direction of said magnetic recording medium so that resistance values of said two magnetoresistive elements in each pair will increase or decrease at the same rate in synchronism with one another as the magnetic recording medium moves past said magnetic head.

5. An arrangement of the magnetic head as claimed in claim 4, wherein the longitudinal axes of said magnetoresistive elements in each pair are spaced apart from each other by an interval of $(\lambda/2)(1+n)$ in the moving direction of said magnetic recording medium, where n is zero or any suitable positive integer.

6. An arrangement of the magnetic head as claimed in claim 5, wherein, under a definition that the interval between any two arms among said four arms is represented by a minimum interval among the intervals between any legs which individually belong to the respective two arms one by one, the interval between two of said four arms adjacently arranged in said bridge circuit through each of the junctions in each of said two pairs of opposite junctions in said bridge circuit is selected to be $(\lambda/4)(1+2n)$, and the interval between the two arms in each of the two pairs of the opposite arms in said bridge circuit is selected to be $(\lambda/2)(1+n)$, where n is zero or any suitable positive integer, so that the resistance values of magnetoresistive elements in opposite arms will undergo the same synchronous changes in their resistance values as the magnetic recording medium moves past said magnetic head.

* * * * *